(12) United States Patent
Thakur et al.

(10) Patent No.: US 6,602,798 B1
(45) Date of Patent: *Aug. 5, 2003

(54) METHOD AND APPARATUS FOR REDUCING ISOLATION STRESS IN INTEGRATED CIRCUITS

(75) Inventors: Randhir P. S. Thakur, Boise, ID (US); Kevin G. Donohoe, Boise, ID (US); Zhiqiang Wu, Dallas, TX (US); Alan R. Reinberg, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/518,154

(22) Filed: Mar. 2, 2000

Related U.S. Application Data

(63) Continuation of application No. 08/904,054, filed on Jul. 31, 1997, now Pat. No. 6,051,511.

(51) Int. Cl.$^7$ .................. H01L 21/31; H01L 21/469
(52) U.S. Cl. .................. 438/762; 438/763; 438/791
(58) Field of Search .................. 438/791, 792, 438/757, 400, 439, 448, 765, 769, 770, 773, 774, 761, 762, 763

(56) References Cited

U.S. PATENT DOCUMENTS

| | | | |
|---|---|---|---|
| 3,549,411 A | 12/1970 | Bean et al. | 117/69 |
| 4,342,617 A | 8/1982 | Fu et al. | 156/643 |
| 4,688,078 A | 8/1987 | Hseih | 357/23.5 |
| 4,851,361 A | 7/1989 | Schumann et al. | 437/30 |
| 5,166,556 A | 11/1992 | Hsu et al. | 307/465 |
| 5,382,551 A | 1/1995 | Thakur et al. | 437/247 |
| 5,422,300 A | 6/1995 | Pfiester et al. | 437/70 |
| 5,468,689 A | 11/1995 | Cunningham et al. | 437/241 |
| 5,541,436 A | 7/1996 | Kwong et al. | 257/410 |
| 5,670,432 A | 9/1997 | Tsai | 437/245 |
| 5,683,922 A | 11/1997 | Jeng | 437/41 SM |
| 5,707,889 A | 1/1998 | Hsu et al. | 437/69 |

(List continued on next page.)

OTHER PUBLICATIONS

Bergendahl, A., et al., "A Flexible Approach for Generation of Arbitrary Etch Profiles in Multilayer Films", *Solid State Technology*, 27, 107–112, (Nov. 1984).

Gerth, R., "Properties of Ammonia–Free Nitrogen–Si3N4 Films Produced at Low Temperatures", *J. Electrochemical Society*, 119, 1248–1254, (Sep. 1972).

Kember, P., et al., "Characterizing Plasna Deposited Silicon Nitride", *Semiconductor International*, 158–161, (Aug. 1985).

(List continued on next page.)

*Primary Examiner*—Evan Pert
(74) *Attorney, Agent, or Firm*—Schwegman, Lundberg, Woessner & Kluth, P.A.

(57) ABSTRACT

Stress resulting from silicon nitride is diminished by forming an oxidation mask with silicon nitride having a graded silicon concentration. Grading is accomplished by changing the silicon content in the silicon nitride by varying the amount of hydride, such as dichlorosilane (DCS), mixed with ammonia. The silicon nitride can be graded in a substantially linear or non-linear fashion. Silicon nitride formed with higher levels of DCS mixed with ammonia is referred to as silicon rich nitride because of its relatively higher silicon content. In one embodiment, the graded silicon nitride may be formed with one type of non-linear silicon grading, an abrupt junction. In other embodiments, the silicon nitride is formed in a variety of shapes fashioned during or after silicon nitride growth. In one embodiment, the stress from the silicon nitride is reduced by forming a polysilicon buffer layer between two silicon nitride layers. In another embodiment, the stress from the silicon nitride is reduced by forming the silicon nitride on a pad layer, which in turn is formed on a base layer.

59 Claims, 3 Drawing Sheets

U.S. PATENT DOCUMENTS

| | | | |
|---|---|---|---|
| 5,739,066 A | | 4/1998 | Pan .............................. 438/595 |
| 5,851,879 A | | 12/1998 | Lin et al. ..................... 438/257 |
| 5,939,763 A | | 8/1999 | Hao et al. .................... 257/411 |
| 6,051,511 A | * | 4/2000 | Thakur et al. |
| 6,090,686 A | * | 7/2000 | Brady et al. ................. 438/439 |
| 6,093,956 A | * | 7/2000 | Moore et al. ................ 257/635 |
| 6,110,784 A | | 8/2000 | Gardner et al. ............. 438/287 |
| 6,174,644 B1 | * | 1/2001 | Shieh et al. |
| 6,297,130 B1 | * | 10/2001 | Rao ............................ 438/444 |

OTHER PUBLICATIONS

Loewenstein, L., "Temperature Dependence of Silicon Nitride Etching by Atomic Fluorine", *J. Appl. Phys., 65*, 386–387, (Jan. 1989).

Paraszczak, J., et al., "Comparison of CF4/O2 and CF2Cl2/O2 Plasmas Used for the Reactive Ion Etching of Single Crystal Silicon", *J. Vac. Sci. Technology, 19*, 1412–1417, (Nov./Dec., 1981).

Wolf, S., "Silicon Processing for the VLSI ERA", *vol. 3, the Submicron Mosfet, Lattice Press, CA*, 340–367, (1995).

* cited by examiner

METHOD AND APPARATUS FOR REDUCING ISOLATION STRESS IN INTEGRATED CIRCUITS

This application is a continuation of U.S. Ser. No. 08/904,054 filed Jul. 31, 1997 now U.S. Pat. No. 6,051,511.

FIELD OF THE INVENTION

The present invention relates to integrated circuits, and in particular to isolation stress reduction in integrated circuits.

BACKGROUND OF THE INVENTION

Field oxide layers electrically isolate semiconductor devices from one another. The most common technique for their formation is termed LOCOS isolation (for LOCal Oxidation of Silicon). Silicon dioxide ($SiO_2$) is formed on silicon surfaces through a process termed oxidation. In the formation of field oxides, $SiO_2$, is thermally grown to thicknesses of between 2,000 to 10,000 angstroms. Usually, oxidation is accomplished by exposing the silicon to an oxidant ambient, such as oxygen ($O_2$) or water ($H_2O$), at elevated temperatures. Oxide is formed on those areas which are not covered by an oxidation mask, such as silicon nitride.

The silicon nitride is deposited by chemical vapor deposition (CVD), and photolithographically patterned to form the oxidation mask, using a dry etch Silicon nitride is an effective mask due to the slow speed with which oxygen and water vapor diffuse in the nitride (typically only a few tens of nanometers of nitride are converted to $SiO_2$ during the field oxide growth process). Therefore, the nitride layer thickness is selected according to the time needed for the field oxidation step. Typically, the nitride masking layer is deposited to a thickness of between 500 and 3,000 angstroms. After field oxidation, the masking layer is removed by a wet etch for subsequent device formation in the regions previously under the mask. Typically, the silicon nitride is formed on another oxide layer, typically called pad oxide. The pad oxide is formed on the silicon by thermal oxidation.

The silicon nitride is susceptible to intrinsic and extrinsic stress. Due to its stoichiometry, silicon nitride formed by low pressure CVD (LPCVD) has a high inherent tensile stress. However, encroachment by the field oxide, commonly referred to as the "bird's beak", into the silicon nitride also creates an extrinsic mechanical stress that increases the overall stress of the silicon nitride. As a result of its high stress, the silicon nitride deforms the periodic lattice of the silicon. Hence, dislocations are created in the silicon which give rise to undesired leakage currents. Thus, for example, in dynamic random access memories (DRAMs), the leakage currents necessitate an increased refresh rate. Therefore, the maximum frequency of read and write operations of the DRAM are reduced because refreshes must occur more often.

Previously, process techniques, such as forming oxide-nitride-oxide polysilicon buffer layers on the silicon, have been attempted to reduce the undesirable leakage currents. However, these techniques have proven unsatisfactory because they entail complex processing steps, and can create additional dislocations. Therefore, there remains a need to diminish the dislocations in the silicon caused by the silicon nitride.

SUMMARY OF THE INVENTION

Stress caused by a silicon nitride mask is diminished by forming the mask with a graded silicon concentration. Grading is accomplished by changing the silicon content in the silicon nitride by varying the amount of hydride, such as dichlorosilane (DCS), mixed with ammonia during oxidation to form the mask. The silicon nitride is graded in a substantially linear or non-linear fashion to vary the silicon nitride stress between compressive and tensile modes to reduce stress.

In one embodiment, the graded silicon nitride may be formed by an abrupt discontinuity, or junction, in the silicon concentration. The abrupt junction is created by forming a second silicon nitride layer on a first silicon nitride layer. The first and second silicon nitride layers have different concentrations of silicon.

In other embodiments, the stress caused by the "bird's beak" can be reduced by forming the silicon nitride in a variety of shapes. The shape of silicon nitride can be fashioned during or after silicon nitride growth. The shape of the silicon nitride can be fashioned after the silicon nitride has been grown, for example, by etching.

In one embodiment, the stress from the silicon nitride is reduced by forming a buffer layer between two silicon nitride layers. The buffer layer may be polysilicon.

An additional benefit of the present invention is that the encroachment of the "bird's beak" into the silicon nitride is decreased or not significantly increased by the aforementioned techniques. As a result, device leakage currents are diminished, while device gain and current capacity is not reduced. Further features and advantages of the present invention, as well as the structure and operation of recent embodiments of the present invention, are described in detail below with reference to the accompanying drawings.

DESCRIPTION OF THE EMBODIMENTS

In the following detailed description, reference is made to the accompanying drawings which form a part hereof, and in which is shown by way of illustration specific embodiments in which the invention may be practiced. These embodiments are described in sufficient detail to enable persons skilled in the art to practice the invention, and it is to be understood that other embodiments may be utilized and that structural, logical and electrical changes may be made without departing from the spirit and scope of the present invention. The following detailed description is, therefore, not to be taken in a limiting sense, and the scope of the present invention is defined by the appended claims. Numbering in the Figures is usually done with the hundreds and thousands digits corresponding to the figure number, with the exception that the same components may appear in multiple figures.

Figure 1A:
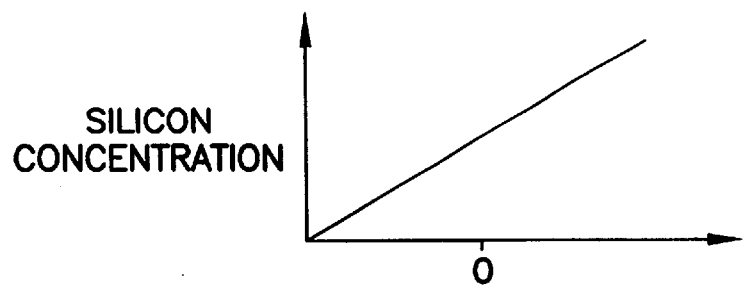
FIG. 1A depicts substantially linear grading of silicon concentration in silicon nitride.
Figure 1B:
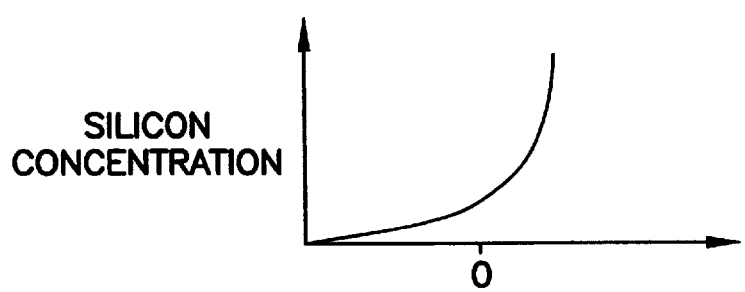
FIG. 1B depicts substantially non-linear grading of silicon concentration in silicon nitride.
Figure 1C:
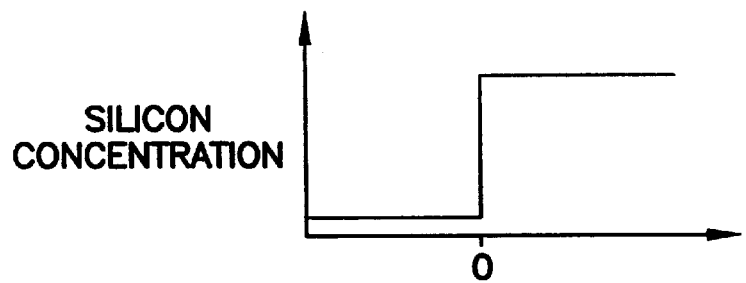
FIG. 1C depicts an abrupt junction of silicon concentration in silicon nitride.
Figure 1D:
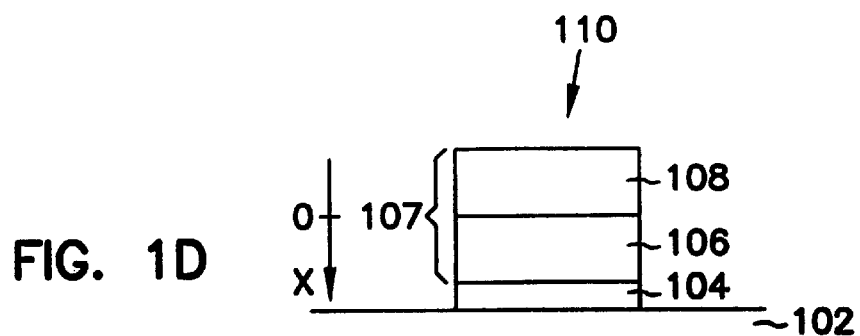
FIG. 1D is a cross-sectional representation of graded silicon nitride films.

In all embodiments of the invention, pad oxide 104 and silicon nitride 107 are successively formed on a base layer 102, as shown in FIG. 1D. The use of the pad oxide 104 is optional. The pad oxide 104 may be formed with silicon dioxide ($SiO_2$) or oxide-nitride-oxide (ONO). The pad oxide 104 is thermally grown in a manner known by those skilled in the art. The thickness of the pad oxide 104 preferably is greater than 10 angstroms. The base layer 102 may be a semiconductor such as silicon. The silicon nitride 107 forms an oxidation mask as described above.

Exemplary embodiments of the present invention will now be described where the base layer 102 comprises silicon. The silicon nitride is formed by exposing the silicon to a mixture of ammonia ($NH_3$) and a hydride in a low pressure chemical vapor deposition (LPCVD) furnace. The exemplary embodiments of the present invention will be described where the hydride is dichlorosilane, or DCS, ($SiH_2Cl_2$). The mole ratio of DCS and ammonia used to form the silicon nitride may range between 10 to 1 and 1 to 10. The LPCVD furnace is operated at a temperature of between approximately 600 to 800 degrees Celsius, and a pressure equal to or less then 700 Torr. The silicon nitride 107 should be formed to be at least 500 angstroms thick. Preferably, the silicon nitride 107 thickness is between 1800 and 1900 angstroms. The silicon nitride 107 is formed to preferably have a stress between $10^8$ and $10^9$ dynes/cm$^2$.

The silicon concentration in the silicon nitride 107 can be graded, as shown in FIGS. 1A–C. Such grading of the silicon nitride 107 is accomplished by time varying the amount of DCS mixed with ammonia so that as the silicon nitride 107 layer grows, the concentration changes. The silicon nitride 107 can be graded in a linear or non-linear fashion, as shown in FIGS. 1A, 1B, and 1C. Silicon nitride 107 formed with higher levels of DCS mixed with ammonia is referred to as silicon rich nitride because of its relatively higher silicon content. The silicon content of the silicon nitride 107 can be characterized by the index of refraction, or refractive index, of the silicon nitride 107. The index of refraction for the silicon nitride 107 should preferably range about from 1.6 to 3.0. The silicon rich nitride has a refractive index of about 3.0.

In one embodiment, shown in FIG. 1A, the silicon concentration can be varied substantially linearly through the thickness of the silicon nitride 107. Alternatively, the silicon concentration is varied continuously and substantially non-linearly, for example in an exponential fashion, while forming the silicon nitride 107, as shown in FIG. 1B. Furthermore, in yet another embodiment, the silicon concentration is varied sharply while forming the silicon nitride 107 to form an abrupt junction, as shown in FIG. 1C. The abrupt junction is formed by first and second nitride layers 106, 108 being formed with different concentrations of silicon.

The stress exerted by the silicon nitride can be varied between tensile and compression modes by modifying the relative amounts of DCS mixed with ammonia. Silicon nitride with higher silicon content has relatively more compressive stress. Therefore, a silicon nitride structure 110 shown in FIG. 1D can be formed with adjacent layers of silicon nitride layers having different silicon concentrations, and thus opposing stresses. As a result, the opposing stresses of the adjacent silicon nitride 107 layers will tend to diminish the effective stress of the silicon nitride structure 110, particularly about the "bird's beak" region. Hence, dislocations and leakage current in the base layer 102 can be diminished. For example, first and second layers of silicon nitride 106, 108 can respectively have compressive and tensile stresses that diminish the effective stress of the silicon nitride structure 110. The first and second nitride layers 106, 108 are preferably silicon nitride and silicon rich nitride, respectively. However, the first and second nitride layers 106, 108 may be respectively silicon rich nitride and silicon nitride. Other techniques for reducing the effective stress of the silicon nitride, particularly about the "bird's beak" region, are subsequently described.

Figure 2:
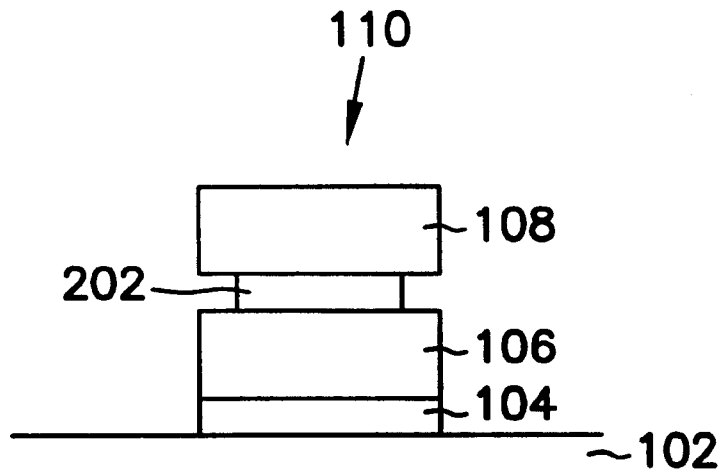
FIG. 2 is a cross-sectional representation of graded silicon nitride films separated by a buffer layer.

In another embodiment, a buffer layer 202, such as polysilicon, can be formed between the first and second nitride layers 106, 108, as shown in FIG. 2. The buffer layer 202 is formed by conventional deposition techniques. The thickness of the buffer layer 202 is about or greater than 50 angstroms, and preferably between 300 and 500 angstroms. The buffer layer 202 is also used to reduce the effective stress of the silicon nitride structure 110. The buffer layer 202 dimensions, including thickness and width, are modified, such as by etching, to optimize the stress reduction. Wet or dry etching may be used. Wet etching may be performed by hot phosphoric acid ($H_3PO_4$). Dry, isotropic etching of a silicon buffer layer can be accomplished with a fluorine chemistry. For example, Paraszcak and Hatzakis, in *J. Vac. Sci. Technol.*, 19(4), 1981, p. 1412, hereby incorporated by reference, teach that $CF_4/O_2$ plasmas in parallel plate etchers isotropically etch silicon. Also, downstream etching of silicon nitride and silicon can be performed isotropically. The relative etch rates of these materials is temperature dependent. The relative etch rates for $Si_3N_4$/poly-silicon/$SiO_2$ can be made to vary from 4/43/2 nm/min. at 16° C. to 97/501/27 nm/min. at 230° C. as disclosed by Lowenstein, in *J. Appl. Phys.*, 65(1), 1989, p. 386, hereby incorporated by reference. The buffer layer 202 may be used between silicon nitride layers 106, 108 in the successively described embodiments.

As illustrated in the following embodiments, the stress from the silicon nitride can be reduced by forming the silicon nitride structure 110 in a variety of shapes. The shape of silicon nitride structure 110 can be fashioned during or after silicon nitride growth.

Figure 3:
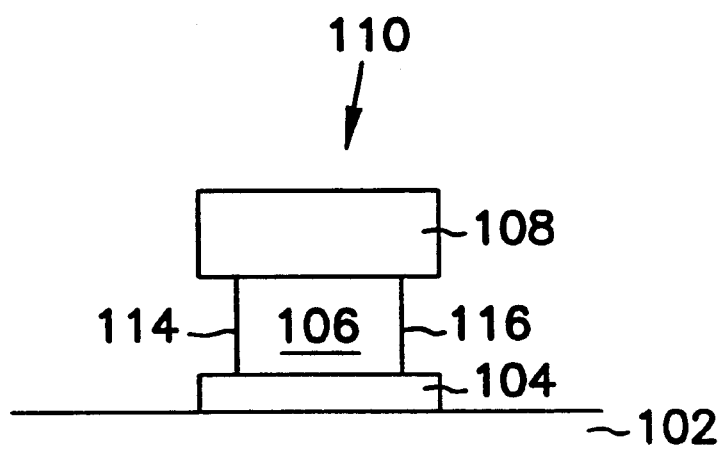
FIG. 3 is a cross-sectional representation of selectively etched graded silicon nitride films.
Figure 4:
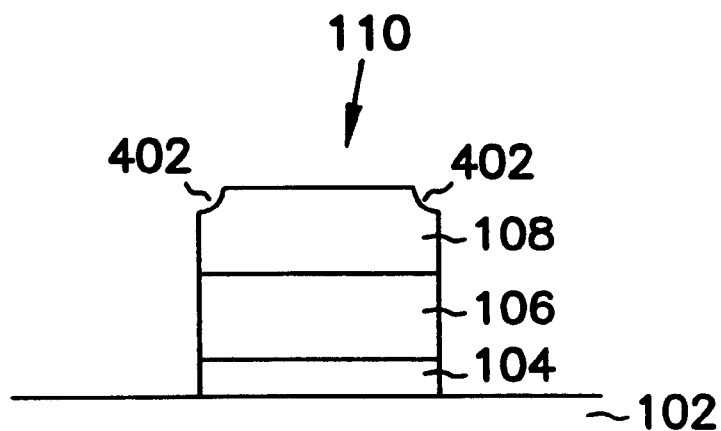
FIG. 4 is a cross-sectional representation of faceted silicon nitride films.

In one embodiment, stress can be reduced in a silicon nitride structure 110 by modifying the shape of the silicon nitride structure 110 after its formation. Portions of silicon nitride can be selectively removed from the silicon nitride structure depending on their silicon content. Removal can be accomplished by appropriate wet or dry etch chemistries. Wet etch chemistries used for removal may include hydrofluoric acid (HF) or hot phosphoric acid. The etch rate of the silicon nitride, using HF for example, depends on the Si—H:N—H bond ratio or silicon nitride deposition temperature. Further information about such etching is disclosed by Kember et al., in *Semiconductor international*, August, 1985, p. 158, and by Gereth et al., in *J. Electrochem. Soc.*, Solid-State Science and Technology, September, 1972, p. 1248, both hereby incorporated by reference. In one embodiment, fluorine chemistries can be used for more quickly etching silicon nitride having a higher content of silicon. FIGS. 3 and 4 illustrate silicon nitride comprising first and second layers 106, 108. The first and second layers 106, 108 maybe formed respectively to be silicon nitride and silicon rich nitride, or visa versa. In FIG. 3, lateral portions of the first silicon nitride layer 106 are selectively removed as indicated at 114 and 116. Alternatively, the outside edges 402 of the second layer 108 may be faceted, as shown in FIG. 4. In another embodiment, faceting is performed by dry etching.

In yet another embodiment, stress reducing shapes of the silicon nitride can be created during silicon nitride formation by, for example, using multiple masking layers with different adjacent and developed cross sections. These techniques are known by persons skilled in the art. As a result, silicon nitride having triangular, trapezoidal and retrograde trapezoidal cross-sections, as respectively shown in FIGS. 5, 6 and 7, can be formed. In these cross-sections, one or more layers of distinct silicon nitride can be formed, as described above. In another embodiment, a silicon nitride structure 110, shown in FIG. 5, can be formed by first etching a silicon nitride structure 110, like the one shown in FIG. 1, and then exposing the structure to an etch with a large sputtering component such as an Argon etch. However, when this technique is used to form a silicon nitride structure 110, the sputter etch may also attack the substrate 102, limiting the degree to which the shape of the silicon nitride structure 110 can be modified.

Figure 5:
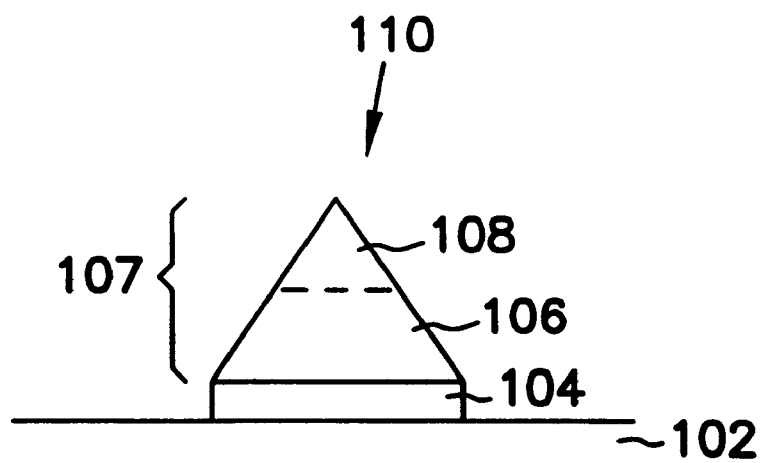
FIG. 5 is a cross-sectional representation of an alternatively shaped silicon nitride film.
Figure 6:
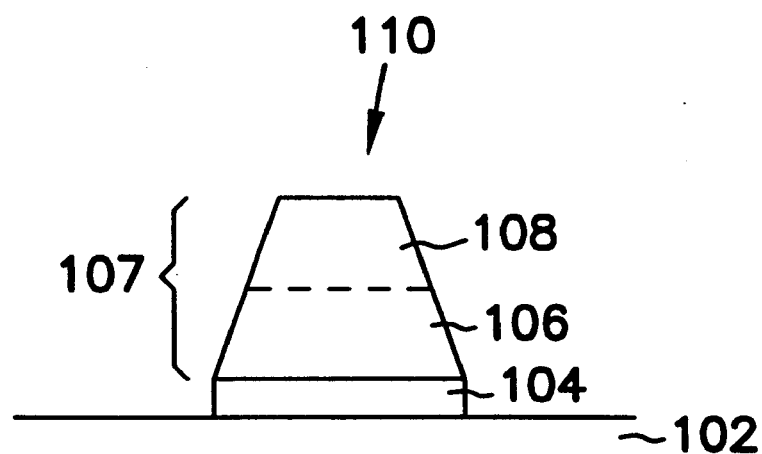
FIG. 6 is a cross-sectional representation of a further alternatively shaped silicon nitride film.
Figure 7:
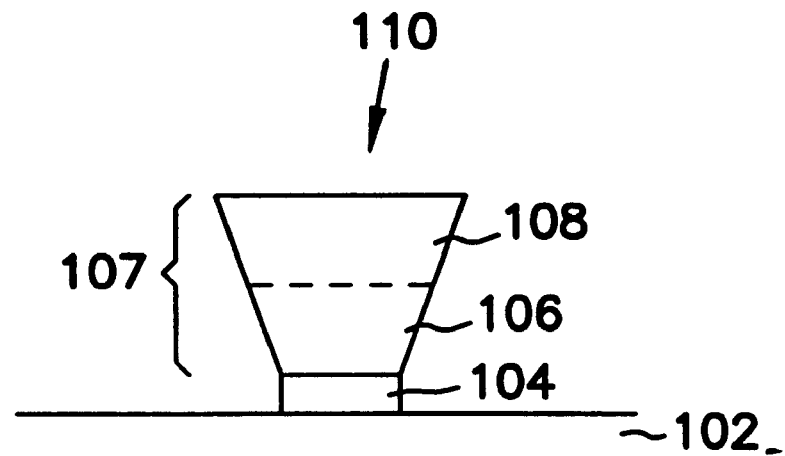
FIG. 7 is a cross-sectional representation of yet another further alternatively shaped silicon nitride film.

The above cross sections may also be formed using common dry etch techniques by varying chemical rations, varying wafer potential and further by using multistep etch processes for producing arbitrarily shaped wall profiles as described in A. S. Bergendahl, D. L. Harmon, and N. T. Pascoe, *Solid State Technol*, November '84, p. 107, hereby incorporated by reference. The slope or angle of the sidewalls from vertical in the silicon nitride structures in FIGS. 5–7 is preferably greater than zero degrees. In one embodiment, it is selected between 10 to 60 degrees to provide optimal stress reduction. The actual angle may vary with the particular geometries of the process in which it is used to provide optimal stress reduction.

In a further embodiment of the invention, the silicon nitride layer is used in conjunction with trench isolation. By varying the silicon content of a silicon nitride layer in a shallow trench, wherein the sidewall of the silicon nitride layer has an angle substantially matching the angle of the trench, stress caused by the silicon nitride layer is reduced.

It is a benefit of the present invention that stress caused by silicon nitride is reduced. It is a further benefit of the present invention that the "bird's beak" region is diminished or not significantly increased. It is to be understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. A method for forming an oxidation mask on a silicon substrate, comprising:
   growing a pad layer on a base layer;
   forming a layer of silicon nitride on the pad layer wherein the pad layer comprises oxide-nitride-oxide; and
   increasing the silicon content in the silicon nitride layer as it is formed.

2. The method of claim 1 wherein the substrate is silicon and the base layer is pad oxide.

3. The method of claim 1 wherein forming a layer of silicon nitride further includes forming a first portion having a first silicon concentration and a second portion having a second silicon concentration, one of the first or second silicon concentrations results in an index of refraction for that portion of the silicon nitride layer of between about 1.6 and 3.0.

4. The method of claim 3 wherein the other of the first or second silicon concentrations results in an index of refraction for that portion of the silicon nitride layer of about 3.0.

5. The method of claim 1 wherein the method further includes varying the silicon concentration from a first silicon concentration in a first layer to a second silicon concentration in a second layer by a step variation so that the first silicon concentration of the first layer increases up to the step variation and the second silicon concentration of the second layer increases from the step variation.

6. The method of claim 1 wherein the thickness of the silicon nitride layer is at least about 500 angstroms.

7. A method for forming an oxidation mask on a silicon substrate, comprising:
   forming a pad layer of oxide-nitride-oxide on a base layer
   forming a layer of silicon nitride on the pad layer; and
   varying the silicon content in the silicon nitride layer as it is formed, wherein the silicon content of the silicon nitride is graded substantially linearly.

8. The method of claim 7 wherein varying the silicon content in the silicon nitride layer as it is formed includes varying the silicon content in a silicon nitride layer having a first silicon nitride layer and a second silicon nitride layer such that the variation of the silicon concentration from the first silicon nitride layer to the second silicon nitride layer is a step variation, wherein the first silicon nitride layer has a first silicon concentration that varies substantially linearly in the first silicon nitride layer and the second silicon nitride layer has a second silicon concentration that varies substantially linearly in the second silicon nitride layer.

9. A method for forming an oxidation mask on a silicon substrate, comprising:
   forming a pad layer of oxide-nitride-oxide on a base layer;
   forming a layer of silicon nitride on the pad layer; and
   varying substantially continuously the silicon content in the silicon nitride layer as it is formed, wherein the silicon content of the silicon nitride is graded substantially non-linearly.

10. The method of claim 9 wherein the substrate is silicon and the base layer is pad oxide.

11. The method of claim 9 wherein varying the silicon content in the silicon nitride layer as it is formed includes varying the silicon content in a silicon nitride layer having a first silicon nitride layer and a second silicon nitride layer such that one of the first or second silicon nitride layers has an index of refraction between about 1.6 and 3.0.

12. The method of claim 11, wherein the other of the first or second silicon nitride layers has an index of refraction of about 3.0.

13. The method of claim 9 wherein varying the silicon content in the silicon nitride layer as it is formed comprises varying the concentration of silicon as the silicon nitride layer is formed so that the concentration varies from a first concentration where the layer of silicon nitride meets the pad layer to a second concentration and the variation in silicon concentration from the first concentration to the second concentration is an exponential function of the thickness of the silicon nitride layer.

14. The method of claim 9 wherein varying the silicon content in the silicon nitride layer as it is formed comprises varying the concentration of silicon as the silicon nitride layer is formed so that the concentration varies from a first concentration where the layer of silicon nitride meets the pad layer to a second concentration, wherein the first concentration of silicon is lower than the second concentration.

15. The method of claim 9 wherein varying the silicon content in the silicon nitride layer as it is formed comprises varying the concentration of silicon as the silicon nitride layer is formed so that the concentration varies from a first concentration where the layer of silicon nitride meets the pad layer to a second concentration, wherein the first concentration of silicon is higher than the second concentration.

16. The method of claim 9 wherein the thickness of the silicon nitride layer is at least about 500 angstroms.

17. The method of claim 9 wherein the method further includes varying a silicon concentration from a first silicon concentration in a first silicon nitride layer to a second silicon concentration in a second silicon nitride layer by a step variation so that the first silicon concentration of the first silicon nitride layer varies substantially non-linearly up to the step variation and the second silicon concentration of the second silicon nitride layer varies substantially non-linearly from the step variation.

18. A method for forming an oxidation mask on a substrate, comprising:
   forming a base layer on at least a portion of the surface of the substrate
   forming a layer of silicon nitride on the base layer which has a silicon concentration that varies substantially continuously from a first silicon concentration adjacent the base layer to a second silicon concentration at the top surface of the layer of silicon nitride.

19. The method of claim 18 wherein the first silicon concentration is higher than the second silicon concentration.

20. The method of claim 18 wherein the second silicon concentration is higher than the first silicon concentration.

21. The method of claim 18, wherein the substrate is silicon and the base layer is pad oxide.

22. The method of claim 18, and further comprising selectively removing at least a portion of silicon nitride based upon its silicon content.

23. The method of claim 18, and further comprising faceting an outside edge of the silicon nitride layer.

24. The method of claim 18 wherein one of the first or second silicon concentrations results in an index of refraction for that portion of the silicon nitride layer of between about 1.6 and 3.0.

25. The method of claim 24 wherein the other of the first or second silicon concentrations results in an index of refraction for that portion of the silicon layer of about 3.0.

26. A method for forming an oxidation mask on a silicon substrate, comprising:
   forming a pad layer of oxide-nitride-oxide on a base layer
   forming a layer of silicon nitride on the pad layer; and
   varying the silicon content in the silicon nitride layer as it is formed, wherein the silicon content of the silicon nitride is graded substantially linearly and the base layer is pad oxide.

27. A method for forming an oxidation mask on a silicon substrate, comprising:
   forming a pad layer of oxide-nitride-oxide on a base layer;
   forming a layer of silicon nitride on the pad layer; and
   varying the silicon content in the silicon nitride layer as it is formed, wherein the silicon content of the silicon nitride is graded substantially linearly, wherein forming a layer of silicon nitride further includes forming a first portion having a first varying silicon concentration and a second portion having a second varying silicon concentration such that one of the first or second varying silicon concentrations results in an index of refraction for that portion of the silicon nitride layer of between about 1.6 and 3.0.

28. The method of claim 27, wherein the other of the first or second silicon concentrations results in an index of refraction for that portion of the silicon nitride layer of about 3.0.

29. A method for forming an oxidation mask on a silicon substrate, comprising:
   growing a pad layer on a base layer;
   forming a layer of silicon nitride on the pad layer wherein the pad layer comprises oxide-nitride-oxide; and
   increasing the silicon content in the silicon nitride layer as it is formed, wherein increasing the silicon content in the silicon nitride layer as it is formed comprises increasing the concentration of silicon as the silicon nitride layer is formed so that the concentration increases from a first concentration where the layer of silicon nitride meets the pad layer to a second concentration and the increase in silicon concentration from the first concentration to the second concentration is a linear function of the thickness of the silicon nitride layer.

30. A method for forming an oxidation mask on a silicon substrate, comprising:
   growing a pad layer on a base layer;
   forming a layer of silicon nitride on the pad layer wherein the pad layer comprises oxide-nitride-oxide; and
   increasing the silicon content in the silicon nitride layer as it is formed, wherein increasing the silicon content in the silicon nitride layer as it is formed comprises increasing the concentration of silicon as the silicon nitride layer is formed so that the concentration increases from a first concentration where the layer of silicon nitride meets the pad layer to a second concentration and the increase in silicon concentration from the first concentration to the second concentration is an exponential function of the thickness of the silicon nitride layer.

31. A method for forming an oxidation mask on a silicon substrate, comprising:
   forming a pad layer of oxide-nitride-oxide on a base layer
   forming a layer of silicon nitride on the pad layer; and
   varying the silicon content in the silicon nitride layer as it is formed, wherein the silicon content of the silicon nitride is graded substantially linearly, wherein varying the silicon content in the silicon nitride layer as it is formed comprises varying the concentration of silicon as the silicon nitride layer is formed so that the concentration increases from a first concentration where the layer of silicon nitride meets the pad layer to a second concentration and the increase in silicon concentration from the first concentration to the second concentration is a linear function of the thickness of the silicon nitride layer.

32. A method for forming an oxidation mask on a substrate, comprising:
   forming a base layer on at least a portion of the surface of the substrate
   forming a layer of silicon nitride on the base layer which has a silicon concentration that varies substantially continuously in a first region from a first silicon concentration in the first region where the surface of the silicon nitride layer is adjacent to the base layer to a second silicon concentration in a second region of the silicon nitride layer which is distal from the first region.

33. The method of claim 32 wherein the thickness of the silicon nitride layer is at least about 500 angstroms.

34. The method of claim 32 wherein the first silicon concentration is higher than the second silicon concentration.

35. The method of claim 24 wherein the second silicon concentration is higher than the first silicon concentration.

36. A method for forming a silicon nitride structure on a substrate, comprising:

forming a base layer on at least a portion of the surface of the substrate forming a layer of silicon nitride on the base layer which has a silicon concentration that varies substantially continuously in a first region from a first silicon concentration in the first region where the surface of the silicon nitride layer is adjacent to the base layer to a second silicon concentration in a second region of the silicon nitride layer which is distal from the first region.

37. The method of claim 36 wherein the thickness of the silicon nitride layer is at least about 500 angstroms.

38. The method of claim 36 wherein the first silicon concentration is higher than the second silicon concentration.

39. The method of claim 36 wherein the second silicon concentration is higher than the first silicon concentration.

40. A method for forming an oxidation mask on a silicon substrate, comprising:

forming a pad layer of oxide-nitride-oxide on a base layer forming a layer of silicon nitride on the pad layer; and varying the silicon content in the silicon nitride layer as it is formed, wherein the silicon content of the silicon nitride is graded substantially linearly, wherein the thickness of the silicon nitride layer is at least about 500 angstroms.

41. A method for forming a silicon nitride structure on a substrate, comprising:

forming a base layer over at least a portion of the surface of the substrate forming a first layer of silicon nitride over the base layer having a first silicon concentration that varies substantially continuously in the first layer;

forming a second layer of silicon nitride over the first layer of silicon nitride, the second layer of silicon nitride having a second silicon concentration.

42. The method of claim 41 wherein the first silicon concentration throughout the first layer of silicon nitride is higher than the second silicon concentration throughout the second layer of silicon nitride.

43. The method of claim 41 wherein the base layer is oxide-nitride-oxide.

44. The method of claim 43 wherein the first silicon concentration throughout the first layer of silicon nitride is lower than the second silicon concentration throughout the second layer of silicon nitride.

45. The method of claim 41 wherein the first silicon layer has an index of refraction ranging about from 1.6 to 3.0 and the second layer has an index of refraction of about 3.0.

46. The method of claim 41 wherein a buffer layer is formed between the forming of the first and second nitride layers.

47. The method of claim 46 wherein the buffer layer is polysilicon.

48. A method for forming an oxidation mask on a silicon substrate, comprising:

forming a layer of silicon nitride on a base layer; and continuously varying the silicon content in the silicon nitride layer as it is formed on the substrate.

49. The method of claim 48, and further comprsing selectively removing at least a portion of silicon nitride based upon its silicon content.

50. The method of claim 48 and further comprising faceting an outside edge of the silicon nitride layer.

51. The method of claim 48, wherein the silicon content of the silicon nitride changes abruptly at a desired depth in the silicon nitride layer.

52. The method of claim 48 wherein the silicon content varies from a first to a second silicon concentration and one of the first or second silicon concentrations results in an index of refraction for that portion of the silicon nitride layer of between about 1.6 and 3.0.

53. The method of claim 52 wherein the other of the first or second silicon concentrations results in an index of refraction for that portion of the silicon layer of about 3.0.

54. A method for forming an oxidation mask on a silicon substrate, comprising:

forming a layer of silicon nitride on a base layer; and continuously varying the silicon content in the silicon nitride layer as it is formed wherein the silicon content of the silicon nitride is graded substantially linearly.

55. The method of claim 54, wherein the silicon content of the silicon nitride changes abruptly at a desired depth in the silicon nitride layer.

56. The method of claim 54 wherein the silicon content varies from a first to a second silicon concentration and one of the first or second silicon concentrations results in an index of refraction for that portion of the silicon nitride layer of between about 1.6 and 3.0.

57. The method of claim 56 wherein the other of the first or second silicon concentrations results in an index of refraction for that portion of the silicon layer of about 3.0.

58. A method for forming an oxidation mask on a silicon substrate, comprising:

forming a layer of silicon nitride on a base layer; and continuously varying the silicon content in the silicon nitride layer as it is formed wherein the silicon content of the silicon nitride is graded substantially non-linearly.

59. The method of claim 58, wherein the silicon content of the silicon nitride changes abruptly at a desired depth in the silicon nitride layer.

* * * * *

UNITED STATES PATENT AND TRADEMARK OFFICE
CERTIFICATE OF CORRECTION

PATENT NO.   : 6,602,798 B1
DATED        : August 5, 2003
INVENTOR(S)  : Randhir P. Thakur et al.

It is certified that error appears in the above-identified patent and that said Letters Patent is hereby corrected as shown below:

<u>Column 9,</u>
Line 9, delete "claim 24" and insert -- claim 32 -- therefor.
Line 56, delete "claim 43" and insert -- claim 41 -- therefor.

<u>Column 10,</u>
Line 14, delete "comprsing" and insert -- comprising -- therefor.

Signed and Sealed this

Twenty-seventh Day of July, 2004

JON W. DUDAS
*Acting Director of the United States Patent and Trademark Office*